US012740288B2

(12) United States Patent
Hu

(10) Patent No.: US 12,740,288 B2
(45) Date of Patent: Sep. 15, 2026

(54) DISPLAY MODULE AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Xiaojing Hu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 385 days.

(21) Appl. No.: 18/558,228

(22) PCT Filed: Jun. 30, 2023

(86) PCT No.: PCT/CN2023/104591
§ 371 (c)(1),
(2) Date: Oct. 31, 2023

(87) PCT Pub. No.: WO2024/109069
PCT Pub. Date: May 30, 2024

(65) Prior Publication Data

US 2025/0098482 A1 Mar. 20, 2025

(30) Foreign Application Priority Data

Nov. 25, 2022 (CN) ........................ 202211493771.X

(51) Int. Cl.
*H10K 59/80* (2023.01)
*H10K 102/00* (2023.01)

(52) U.S. Cl.
CPC ... *H10K 59/8722* (2023.02); *H10K 2102/311* (2023.02)

(58) Field of Classification Search
CPC ..................... H10K 59/8722; H10K 2102/311
(Continued)

(56) References Cited

U.S. PATENT DOCUMENTS

2018/0053817 A1 2/2018 Kishimoto
2022/0061168 A1* 2/2022 Shin ..................... H05K 5/0217
2023/0195173 A1* 6/2023 Yang ..................... G06F 1/1656
361/679.01

FOREIGN PATENT DOCUMENTS

CN 113012579 A 6/2021
CN 113471258 A 10/2021
(Continued)

OTHER PUBLICATIONS

Chinese Office Action issued in corresponding Chinese Patent Application No. 202211493771.X dated Feb. 11, 2025, pp. 1-9.
(Continued)

*Primary Examiner* — Binh B Tran
(74) *Attorney, Agent, or Firm* — PV IP PC; Peter Stecher; Wei Te Chung

(57) ABSTRACT

The present application discloses a display module and a display device. An end of a bending portion is connected to a display portion, and the other end of the bending portion is bent toward a side of the display portion close to a binding portion and is connected to the binding portion. A composite functional layer includes a buffer sublayer attached to a side of the display portion close to the binding portion, and a support sublayer attached to a side of the buffer sublayer away from the display portion. The binding portion is attached to a side of the support sublayer away from the buffer sublayer, and the buffer sublayer includes a polyurethane rubber material containing silicon.

20 Claims, 2 Drawing Sheets

(58) Field of Classification Search
USPC .......................................................... 361/749
See application file for complete search history.

(56) References Cited

FOREIGN PATENT DOCUMENTS

| | | | |
|---|---|---|---|
| CN | 114203048 | A | 3/2022 |
| CN | 114203050 | A | 3/2022 |
| CN | 114743460 | A | 7/2022 |
| CN | 114973951 | A | 8/2022 |
| CN | 115116336 | A | 9/2022 |
| CN | 115775499 | A | 3/2023 |
| KR | 20200129646 | A | 11/2020 |
| KR | 20220041270 | A | 4/2022 |
| KR | 20220080862 | A | 6/2022 |
| KR | 20220137850 | A | 10/2022 |

OTHER PUBLICATIONS

Korean Office Action issued in corresponding Japanese Patent Application No. 10-2023-7041053 dated Dec. 17, 2024, pp. 1-8.
International Search Report in International application No. PCT/CN2023/104591, mailed on Oct. 23, 2023.
Written Opinion of the International Search Authority in International application No. PCT/CN2023/104591, mailed on Oct. 23, 2023.
China Petroleum and Chemical Industry pp. 310-311 Dec. 31, 2006 China's Petroleum and Chemical Industry "Tenth Five-Year Plan" Report China Petroleum and Chemical Industry Association.

* cited by examiner

DISPLAY MODULE AND DISPLAY DEVICE

TECHNICAL FIELD

The present application relates to the field of display technologies, and more particularly, to a display module and a display device with the same.

BACKGROUND

In modern communication industry, market demand for mobile phones, televisions, tablets, notebooks, digital cameras and other products is increasing, and various display devices are developing in larger size and flexibly. Pad-Bending technology is one of key technologies for a narrow bezel of a flexible organic light-emitting diode (OLED) display panel. With this technology, a narrow bezel is realized by folding a bending portion at a terminal area of a display panel to back of the display panel at a certain angle and a certain radius.

Conventional display panels can reduce width of lower bezel to a certain extent by bending and binding. However, at the lower bezel of the display panel, a space is needed to accommodate the bending portion of the display panel, so that the width of the lower bezel of the display panel cannot be further reduced.

Technical Problem

Embodiments of the present application provide a display module and a display device, which can reduce a bezel width of the display module and increase a screen-to-body ratio of the display module.

Technical Solution

An embodiment of the present application provides a display module including a display panel and a composite functional layer, and the display panel includes:

- a display portion;
- a binding portion provided on a side of the display unit; and
- a bending portion, wherein an end of the bending portion is connected to the display portion, and another end of the bending portion is bent toward a side of the display portion close to the binding portion and is connected to the binding portion;
- wherein the composite functional layer includes a buffer sublayer attached to the side of the display portion close to the binding portion, and a support sublayer attached to a side of the buffer sublayer away from the display portion; the binding portion is attached to a side of the support sublayer away from the buffer sublayer; and material of the buffer sublayer includes a polyurethane rubber material containing silicon.

In an embodiment of the present application, a distance between the binding portion and the display portion in a thickness direction of the composite functional layer is less than 260 μm.

In an embodiment of the present application, a distance between the binding portion and the display portion in a thickness direction of the composite functional layer is greater than or equal to 128 μm, and less than or equal to 248 μm.

In an embodiment of the present application, a thickness of the buffer sublayer is greater than or equal to 40 μm, and less than or equal to 150 μm; and elastic modulus of the buffer sublayer is greater than or equal to 50 kPa, and less than or equal to 500 kPa.

In an embodiment of the present application, elastic modulus of the support sublayer is greater than or equal to 50 GPa, and less than or equal to 250 GPa.

In an embodiment of the present application, the support sublayer has a thickness greater than or equal to 30 μm, and less than or equal to 150 μm.

In an embodiment of the present application, the composite functional layer further includes a first adhesive layer disposed between the buffer sublayer and the display portion, and a second adhesive layer disposed between the buffer sublayer and the support sublayer;

- wherein a thickness of the first adhesive layer is greater than or equal to 13 μm, and less than or equal to 50 μm; and a thickness of the second adhesive layer is greater than or equal to 35 μm, and less than or equal to 50 μm.

In an embodiment of the present application, at least one of the first adhesive layer and the second adhesive layer includes a black adhesive material, and at least one of the first adhesive layer and the second adhesive layer is doped with carbon powder particles.

In an embodiment of the present application, the support sublayer includes a first sub-portion, and a second sub-portion disposed on a side of the first sub-portion close to the bending portion; the second sub-portion has a thickness less than the first sub-portion; a distance from a side surface of the second sub-portion away from the display portion to the display portion is less than a distance from a side surface of the first sub-portion away from the display portion to the display portion;

- wherein the binding portion is attached to a side of the second sub-portion away from the display portion.

In an embodiment of the present application, the composite functional layer at least includes a third adhesive layer disposed between the binding portion and the support sublayer, the binding portion is attached to the side of the second sub-portion away from the display portion by the third adhesive layer;

- wherein a thickness of the third adhesive layer is greater than or equal to a difference between a thickness of the first sub-portion and a thickness of the second sub-portion.

In an embodiment of the present application, the thickness of the third adhesive layer is greater than or equal to 50 μm, and less than or equal to 100 μm.

In an embodiment of the present application, the third adhesive layer includes a first adhesive disposed between the binding portion and the support sublayer, and a second adhesive attached to a side of the bending portion close to the composite functional layer; and the second adhesive is connected to the first adhesive.

In an embodiment of the present application, at least one of the buffer sublayer and the third adhesive layer is doped with carbon powder particles.

In an embodiment of the present application, a distance from the binding portion to the first sub-portion is greater than or equal to 0, and less than or equal to 300 μm in a direction along the second sub-portion toward the first sub-portion.

According to the above object of the present application, an embodiment of the present application further provides a display device including a display module with a display panel and a composite functional layer, and the display panel includes:

- a display portion;

a binding portion provided on a side of the display unit; and a bending portion, wherein an end of the bending portion is connected to the display portion, and another end of the bending portion is bent toward a side of the display portion close to the binding portion and is connected to the binding portion;

wherein the composite functional layer includes a buffer sublayer attached to the side of the display portion close to the binding portion, and a support sublayer attached to a side of the buffer sublayer away from the display portion; the binding portion is attached to a side of the support sublayer away from the buffer sublayer; and material of the buffer sublayer includes a polyurethane rubber material containing silicon.

In an embodiment of the present application, distance between the binding portion and the display portion in a thickness direction of the composite functional layer is less than 260 μm.

In an embodiment of the present application, the composite functional layer further includes a first adhesive layer disposed between the buffer sublayer and the display portion, and a second adhesive layer disposed between the buffer sublayer and the support sublayer;

wherein a thickness of the first adhesive layer is greater than or equal to 13 μm, and less than or equal to 50 μm; and a thickness of the second adhesive layer is greater than or equal to 35 μm, and less than or equal to 50 μm.

In an embodiment of the present application, at least one of the first adhesive layer and the second adhesive layer includes a black adhesive material, and at least one of the first adhesive layer and the second adhesive layer is doped with carbon powder particles.

In an embodiment of the present application, the support sublayer includes a first sub-portion, and a second sub-portion disposed on a side of the first sub-portion close to the bending portion; the second sub-portion has a thickness less than the first sub-portion; a distance from a side surface of the second sub-portion away from the display portion to the display portion is less than a distance from a side surface of the first sub-portion away from the display portion to the display portion;

wherein the binding portion is attached to a side of the second sub-portion away from the display portion.

In an embodiment of the present application, the composite functional layer at least includes a third adhesive layer disposed between the binding portion and the support sublayer, the binding portion is attached to the side of the second sub-portion away from the display portion by the third adhesive layer;

wherein a thickness of the third adhesive layer is greater than or equal to a difference between a thickness of the first sub-portion and a thickness of the second sub-portion.

Beneficial Effect

According to the present application, a buffer sublayer is prepared by a polyurethane rubber material containing silicon, so that the buffer sublayer has a better buffer performance, a better antistatic performance, and a better heat dissipation performance, which can replace a back plate and a buffer layer in a heat dissipation composite material in the related art. Therefore, the number of film layers in a display module can be effectively reduced, that is, a thickness of the buffer sublayer can be reduced relative to a sum of a thickness of the back plate and the buffer layer in the heat dissipation composite material. A distance between a binding portion and a display portion can be reduced, so that a bending radius of a bending portion can be reduced, and further, the bezel width of a side of the display module corresponding to the bending portion can be reduced, thereby providing narrow bezel for the display module.

BRIEF DESCRIPTION OF THE DRAWINGS

The technical solution and other beneficial effects of the present application will be apparent from the following detailed description of embodiments thereof, taken in conjunction with the accompanying drawings.

DETAILED DESCRIPTION OF THE EMBODIMENTS

Figure 1:
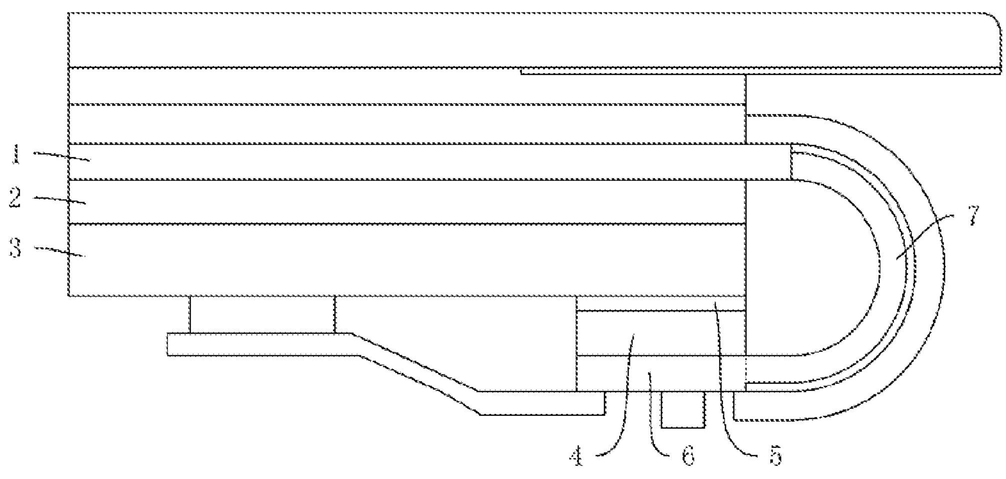
FIG. 1 is a schematic structural diagram of a display module according to related art.

The technical solution in the embodiments of the present application will be clearly and completely described with reference to the accompanying drawings. It should be understood that the described embodiments are only part of the examples of the present application, and not all examples. Based on the embodiments in the present application, all other embodiments obtained by a person skilled in the art without involving any inventive effort are in the scope of the present application.

The following disclosure provides many different embodiments or examples for the different structures of the present application. In order to simplify the disclosure of the present application, components and arrangements of specific examples are described below. It should be understood that the examples are merely for description and are not intended to limit the application. In addition, the present application may repeat reference numerals and/or reference letters in different examples, such repetition is for the purpose of simplicity and clarity, without indicating a relationship between the various embodiments and/or arrangements discussed. In addition, the present application provides examples of various specific processes and materials, but one of ordinary skill in the art could recognize the application of other processes and/or the use of other materials.

Referring to FIG. 1, in the related art, the lower bezel of the display module needs to be bent to reduce the width of the bezel. A back side of a panel body 1 is provided with a back plate 2 and a heat dissipation composite material 3. A binding portion 6 of the panel body 1 needs to be bent to the side of the heat dissipation composite material 3 away from the back plate 2 through a bending portion 7, to realize bending and binding. A sub back plate 4 and an adhesive layer 5 are provided between the binding portion 6 and the panel body 1, to attach the binding portion 6 to the heat dissipation composite material 3. Specifically, the back plate 2 generally includes an adhesive layer, a base material layer, and the like, which are stacked. The heat dissipation composite material 3 generally includes a heat dissipation layer, a soaking layer, a mechanical property reinforcing layer, a buffer layer, a light shielding adhesive layer, and the like, which are stacked. The heat dissipation composite material 3 has a thick thickness due to the multiple-film layer structure. Specifically, the thickness of the back plate 2 generally ranges from 90 μm to 150 μm, the thickness of the heat dissipation composite material 3 generally ranges from 260 μm to 350 μm, and the thickness of the adhesive layer 5 generally ranges from 50 μm to 300 μm. With adding the sub back plate 4, the distance between the panel body 1 and the binding portion 6 generally ranges from 450 μm to 950 μm, which results in that the bending radius of the bending portion 7 needs to be adapted to the distance between the panel body 1 and the binding portion 6. As such, the bending radius of the bending portion 7 is large, thereby restricting further reduction of the width of the lower bezel of the display module, and causing a difficulty in the narrower bezel of the display module.

Figure 2:
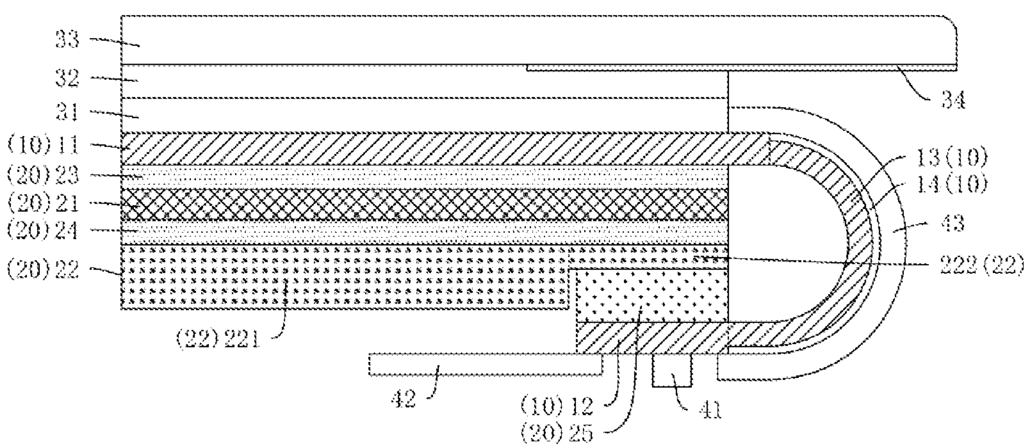
FIG. 2 is a schematic structural diagram of a display module according to an embodiment of the present application.
Figure 3:
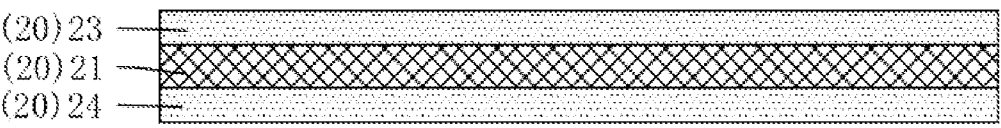
FIG. 3 is a schematic diagram of a stacked structure defined by a buffer sublayer, a first adhesive layer, and a second adhesive layer according to an embodiment of the present application.
Figure 4:
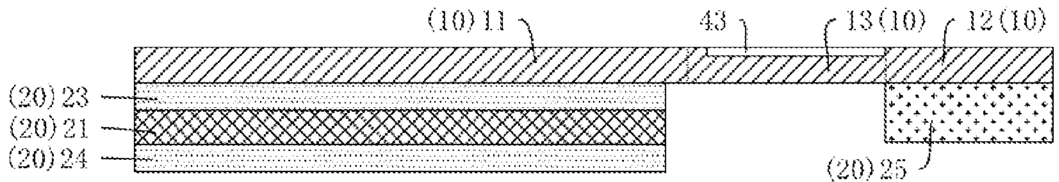
FIG. 4 is a schematic diagram of a stacked structure defined by a display panel, a buffer sublayer, a first adhesive layer, and a second adhesive layer according to an embodiment of the present application.
Figure 5:
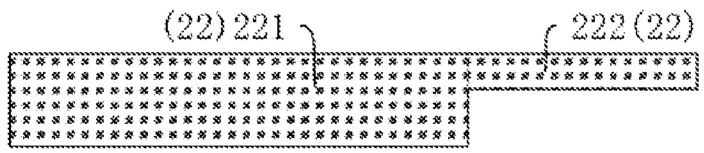
FIG. 5 is a schematic structural diagram of a support sublayer according to an embodiment of the present application.
Figure 6:
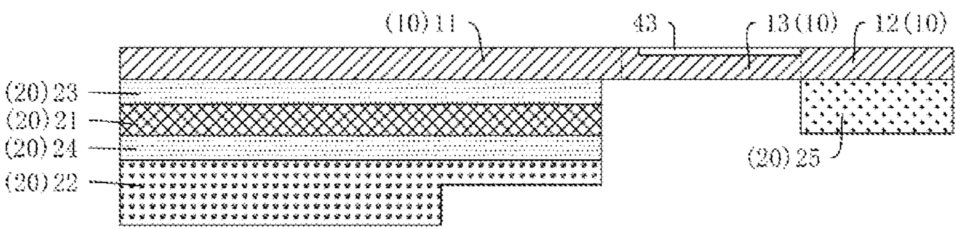
FIG. 6 is a schematic diagram of a stacked structure defined by a display panel and a composite functional layer according to an embodiment of the present application.

An embodiment of the present application provides a display module. Referring to FIG. 2, the display module includes a display panel 10 and a composite functional layer 20.

The display panel 10 includes a display portion 11, a binding portion 12, and a bending portion 13. The binding portion 12 is provided on a side of the display portion 11. An end of the bending portion 13 is connected to the display portion 11, and the other end of the bending portion 13 is bent toward a side of the display portion 11 close to the binding portion 12 and connected to the binding portion 12.

The composite functional layer 20 includes a buffer sublayer 21 attached to a side of the display portion 11 close to the binding portion 12, and a support sublayer 22 attached to a side of the buffer sublayer 21 away from the display portion 11. The binding portion 12 is attached to a side of the support sublayer 22 away from the buffer sublayer 21, and the buffer sublayer 21 includes a polyurethane rubber material containing silicon.

In practical application, the buffer sublayer 21 is prepared with the polyurethane rubber material containing silicon, according to the embodiment of the present application. The polyurethane rubber material containing silicon has a higher density relative to the polyurethane rubber material, so that the buffer sublayer 21 has a certain performance on support, and a better performance on buffer and antistatic function. Thus, the buffer sublayer 21 of the present application can replace the buffer sublayer in the back plate and the heat dissipation composite in the related art. The buffer sublayer 21 in embodiments of the present application reduce the thickness of the display module by less number of film layers therein, thereby effectively reducing the distance between the binding portion 12 and the display portion 11, the bending radius of the bending portion 13, and the bezel width on a side of the display module corresponding to the bending portion 13, and thereby further providing a narrow bezel of the display module.

Specifically, in an embodiment of the present application, referring to FIG. 2, the display module includes a display panel 10, a composite functional layer 20, a polarizer 31, a transparent adhesive layer 32, and a cover plate 33.

The display panel 10 includes a display portion 11 configured to display a picture, a binding portion 12 disposed on a side of the display portion 11 away from a display surface, and a bending portion 13. An end of the bending portion 13 is connected to the display portion 11, and the other end of the bending portion 13 is bent toward the side away from the display portion 11 and connected to the binding portion 12. As such, an end of the display panel 10 close to the binding portion 12 is bent to the back side of the display portion 11 for binding a driving assembly.

The composite functional layer 20 is provided between the display portion 11 and the binding portion 12 to support the display portion 11 and the binding portion 12, the polarizer 31 is provided on a side of the display portion 11 away from the binding portion 12, the transparent adhesive layer 32 is provided on the side of the polarizer 31 away from the display portion 11, and the cover plate 33 is attached to the side of the polarizer 31 away from the display portion 11 by the transparent adhesive layer 32. In addition, the display module further includes a light-shielding member 34 disposed between the transparent adhesive layer 32 and the cover plate 33, and the light-shielding member 34 may be a light-shielding adhesive tape, an ink, or the like to shield a bezel portion of the display module not for display.

Further, the display module further includes a driving chip 41 and a flexible circuit board 42, wherein the driving chip 41 and the flexible circuit board 42 are bound to the binding portion 12. The display panel 10 further includes a wiring portion 14 provided on the bending portion 13, and the wiring portion 14 can transmit signals from the driving chip 41 and the flexible circuit board 42 to the display portion 11, to realize the display function of the display portion 11. The wiring portion 14 may be patterned, for example, an opening may be provided in the wiring portion 14, to reduce the bending stress on the wiring portion 14 and improve the yield of the display panel 10. Similarly, a base of the bending portion 13 may be patterned to further reduce the bending stress on the bending portion 13 during the bending process.

The display module further includes a protective adhesive layer 43 disposed on a side of the bending portion 13 away from the composite functional layer 20 to cover the wiring portion 14 and a side surface of the bending portion 13 away from the composite functional layer 20. The protective adhesive layer 43 may include a UV adhesive material.

In an embodiment of the present application, the composite functional layer 20 includes a buffer sublayer 21 attached to a side of the display portion 11 close to the binding portion 12, and a support sublayer 22 attached to a side of the buffer sublayer 21 away from the display portion 11.

Further, the composite functional layer 20 includes a first adhesive layer 23, a second adhesive layer 24, and a third adhesive layer 25, wherein the buffer sublayer 21 is attached to a side surface of the display portion 11 close to the binding portion 12 by the first adhesive layer 23, the support sublayer 22 is attached to a side surface of the buffer sublayer 21 away from the display portion 11 by the second adhesive layer 24, and the binding portion 12 is attached to a side surface of the support sublayer 22 away from the buffer sublayer 21 by the third adhesive layer 25.

In an embodiment, the buffer sublayer 21 includes a polyurethane rubber material containing silicon, wherein a polyurethane rubber material containing silicon has a higher density and an excellent buffer performance relative to a conventional polyurethane rubber material, while also having an antistatic effect. Further, with more excellent properties of the buffer sublayer 21 in embodiments of the present application, a back plate and a buffer layer in a heat radiation composite in related art can be replaced, so as to reduce the number of film layers in the display module, thereby reducing the thickness of the composite functional layer 20.

It should be noted that, in the embodiment of the present application, the buffer sublayer 21 and the support sublayer 22 are both of a single-layer film structure, so that the purpose of replacing a greater number of film layers in the related art with a less number of film layers can be achieved, to reduce the distance between the display portion 11 and the binding portion 12.

In an embodiment, the materials of the first adhesive layer 23, the second adhesive layer 24, and the third adhesive layer 25 may be silicon-based or acrylic adhesive. The first adhesive layer 23 and/or the second adhesive layer 24 may be black adhesive to improve the light-shielding effect of the composite functional layer 20. Meanwhile, carbon powder particles are doped in at least one of the buffer sublayer 21, the first adhesive layer 23, the second adhesive layer 24, and the third adhesive layer 25. That is, in the embodiment of the present application, the buffer sublayer 21, the first adhesive layer 23, the second adhesive layer 24, and the third adhesive layer 25 can be doped with carbon powder particles, so that the heat dissipation performance of the buffer sublayer 21, the first adhesive layer 23, the second adhesive layer 24, and the third adhesive layer 25 can be improved. Thus, the composite functional layer 20 provided in the embodiment of the present application has a better performance on buffer, antistatic effect, light-shielding, and heat dissipation, to replace the heat dissipation layer, the soaking layer, the buffer layer, and the light-shielding adhesive layer in the heat dissipation composite material, and the back plate in the related art. The number of functional film layers of the display module of the present application is effectively reduced, so that the thickness of the composite functional layer 20 can be less than the sum of the thickness of the back plate and the heat dissipation composite material in the related art. The distance between the binding portion 12 and the display portion 11 is shorter. That is, the distance between the binding portion 12 and the display portion 11 in the thickness direction of the composite functional layer 20 is shorter. The bending radius of the bending portion 13 is reduced, that is, the bending portion 13 takes less space, to reduce bezel width of the display module and to provide narrow bezel for the display module.

It should be understood that in the embodiment of the present application, while the distance between the binding portion 12 and the display portion 11 is reduced, length of the binding portion 12 and length of the bending portion 13 is less than the related art, so that the bending radius of the bending portion 13 can be effectively reduced.

In an embodiment, elastic modulus of the buffer sublayer 21 is greater than or equal to 50 kPa, and less than or equal to 500 kPa. Transmittance of the buffer sublayer 21 is greater than or equal to 88%.

In addition, the material of the support sublayer 22 may include stainless steel, carbon fiber or aluminum alloy, and the elastic modulus of the above-mentioned material is great to provide a better support function. Compared with polyimide of the mechanical property reinforcing layer in the related art, the support sublayer 22 in the present embodiment has a better performance. In addition, the thickness of the support sublayer 22 may be made thin to further reduce the distance between the display portion 11 and the binding portion 12, further reduce the bending radius of the bending portion 13, and reduce bezel width of the display module. At the same time, the support sublayer 22 can be made of a metal material with better heat dissipation performance, to further improve the heat dissipation performance of the composite functional layer 20.

In an embodiment, elastic modulus of the support sublayer 22 may be greater than or equal to 50 GPa, and less than or equal to 250 GPa.

Referring to FIG. 2, the support sublayer 22 includes a first sub-portion 221, and a second sub-portion 222 connected to the first sub-portion 221, wherein a thickness of the second sub-portion 222 is less than a thickness of the first sub-portion 221. The distance from a side surface of the second sub-portion 222 away from the display portion 11 to the display portion 11 is smaller than the distance from a side surface of the first sub-portion 221 away from the display portion 11 to the display portion 11. The side surface of the second sub-portion 222 close to the display portion 11 is flush with the side surface of the first sub-portion 221 close to the display portion 11. The binding portion 12 is attached to the side surface of the second sub-portion 222 away from the display portion 11 by the third adhesive layer 25, thereby further reducing the distance between the display portion 11 and the binding portion 12, further reducing the bending radius of the bending portion 13, and reducing the bezel width of the display module.

It should be noted that in the related art, as shown in FIG. 1, before the binding portion 6 is bent to the back side of the panel body 1 for attaching, a sub back plate 4 is added for support. As such, after the binding portion 6 is bent and attached, the sub back plate 4 and the adhesive layer 5 are sandwiched between the binding portion 6 and the heat dissipation composite material 3. In the embodiment of the present application, with reference to FIG. 2, a PET protective film is attached to a side of the third adhesive layer 25 away from the binding portion 12 before the binding portion 12 is bent to the back side of the panel body 1 for attaching, to support the binding portion 12 and protect attaching surface of the third adhesive layer 25. The PET protective film is removed during attaching the binding portion 12 to the support sublayer 22, so that the binding portion 12 is attached to the support sublayer 22. Further, compared with the related art, the sub back plate 4 is not needed according to the present application, and the distance between the binding portion 12 and the display portion 11 is further reduced. Thus, the bending radius of the bending portion 13 is reduced, that is, the bending portion 13 takes less space, and further, the bezel width of the display module 13 can be reduced, thereby realizing narrow bezel for the display module.

In the embodiment of the present application, the distance between the binding portion 12 and the display portion 11 in the thickness direction of the composite functional layer 20 is less than 260 μm, and is much less than the distance ranging from 490 μm to 950 μm between the panel body and the binding portion in the related art. Further, in the embodiment of the present application, the buffer sublayer 21 has certain support performance, as well as better buffer performance and antistatic performance; and the composite functional layer 20 has good heat dissipation performance by doping carbon powder particles in one of the first adhesive layer 23, the second adhesive layer 24, the third adhesive layer 25, and the buffer sublayer 21. The first adhesive layer 23 and the second adhesive layer 24 may be made of a black adhesive material to provide a light-shielding performance. The support sublayer 22 may be made by a metallic material or carbon fiber to provide excellent support performance. The composite functional layer 20 in the present application has the above-mentioned excellent performance, which can replace the back plate and the heat dissipation composite material in the related art, to reduce the number of film layers in the display module, the distance between the binding portion 12 and the display portion 11, the bending radius of the bending portion 13, thereby reducing the bezel width of the display module.

Further in an embodiment, the distance between the binding portion 12 and the display portion 11 in the thickness direction of the composite functional layer 20 is greater than or equal to 128 μm, and less than or equal to 248 μm.

Specifically, the thickness of the buffer sublayer 21 is greater than or equal to 40 μm, and less than or equal to 150 μm, to provide sufficient buffer performance and antistatic performance for the composite functional layer 20. In a case that the thickness of the support sublayer 22 is too thin, a poor phenomenon such as a mark is easily generated; and in a case that the thickness of the support sublayer 22 is too thick, peeling easily occurs at a curving side during applying a display panel to a curving screen. The thickness of the support sublayer 22 is greater than or equal to 30 μm, and less than or equal to 150 μm; so that the composite functional layer 20 has a good support performance while the thickness is not too thick. The thickness of the first adhesive layer 23 is greater than or equal to 13 μm, and less than or equal to 50 μm; the thickness of the second adhesive layer 24 is greater than or equal to 35 μm, and less than or equal to 50 μm; and the thickness of the third adhesive layer 25 is greater than or equal to 50 μm, and less than or equal to 100 μm; so that the thickness of the composite functional layer 20 can be reduced while the adhesive performance of each adhesive layer is sufficient. At the same time, the carbon powder particles can be doped in the buffer sublayer 21, the first adhesive layer 23, the second adhesive layer 24, and the third adhesive layer 25 to improve the heat dissipation performance of the composite functional layer 20. In this embodiment of the present application, the first adhesive layer 23, the second adhesive layer 24, and the third adhesive layer 25 can perform other functions, such as light-shielding and heat dissipation, in addition to attaching to the film layer in the composite functional layer 20. Thus, the composite functional layer 20 in the embodiment of the present application with only three adhesive layers can replace the functional layers in the heat dissipation composite material 3 in the related art. The present embodiment can reduce not only the number of adhesive layers but also the number of other functional film layers to further reduce the thickness of the composite functional layer 20.

Further, the embodiment of the present application selects a thickness of each film layer in the composite functional layer 20 of the display panel and verifies the performance thereof. The details are provided following.

Example 1: a first adhesive layer 23, a buffer sublayer 21, a second adhesive layer 24, and a support sublayer 22 may be sequentially formed on a back side of a sample panel. A thickness of the first adhesive layer 23 is 35 μm, a thickness of the buffer sublayer 21 is 50 μm, a thickness of the second adhesive layer 24 is 35 μm, and a thickness of the support sublayer 22 is 70 μm. As such, a sum of the thickness of the first adhesive layer 23, the buffer sublayer 21, the second adhesive layer 24, and the support sublayer 22 is 190 μm.

Example 2: a first adhesive layer 23, a buffer sublayer 21, a second adhesive layer 24, and a support sublayer 22 may be sequentially formed on a back side of a sample panel. A thickness of the first adhesive layer 23 is 35 μm, a thickness of the buffer sublayer 21 is 50 μm, a thickness of the second adhesive layer 24 is 35 μm, and a thickness of the support sublayer 22 is 100 μm. As such, a sum of the thickness of the first adhesive layer 23, the buffer sublayer 21, the second adhesive layer 24, and the support sublayer 22 is 220 μm.

Comparative Example: a back plate 2 and a heat dissipation composite material 3 may be sequentially formed on a back side of a sample panel, wherein a thickness of the back plate is 88 μm, and the heat dissipation composite material includes a light-shielding adhesive layer, a buffer layer, and a copper layer. The copper layer can serve as a support and heat dissipation layer. A thickness of the light-shielding adhesive layer is 40 μm, a thickness of the buffer layer is 126 μm, and a thickness of the copper layer is 65 μm, and a sum of the thickness of the back plate 2 and the heat radiation composite material 3 is 319 μm.

It should be noted that Example 1, Example 2, and Comparative Example use same panels.

Specifically, the embodiments of the present application perform mark test, back extrusion test, and back drop test on Example 1, Example 2, and Comparative Example to test the buffer performance and the support performance of the composite functional layer 20 provided in the embodiments of the present application.

Here, in the mark test, a flat area of a display surface is marked in a dark room in a strong light environment, and then the back side of the sample panel is pressed by using a pressing head, specifically by a 2.5*8 mm stainless steel rectangular flat head, at 4 mm/min (i.e., pressed 4 mm per minute), holding the pressure for 5 s, wherein an initial value of the pressure is 11N, and each increase of the pressure is 1N until a large-angle mark appears on appearance. Table 1 as follows is obtained.

TABLE 1

Results of Mark Test

| Scheme | Comparative Example | Example 1 | Example 2 |
|---|---|---|---|
| Total thickness/μm | 319 | 190 | 220 |
| Number of tests | 5 | 5 | 5 |
| Maximum pressure | 46 | 110 | 125 |
| of marks appeared | 44 | 108 | 120 |
| under a large- | 45 | 112 | 123 |
| angle view in | 46 | 113 | 125 |
| strong light/N | 46 | 112 | 123 |

In the back extrusion test, the sample panel is illuminated first, and the back of the sample panel is pressed then by using a ball head which is stainless steel with diameter of φ10 mm, at 4 mm/min (i.e., pressed 4 mm per minute), holding the pressure for 5 s, wherein an initial value of the pressure is 160 N, and each increase of the pressure is 20N until a bright/black spot appears on appearance. Table 2 as follows is obtained.

TABLE 2

Results of Back Extrusion Test

| Scheme | Comparative Example | Example 1 | Example 2 |
|---|---|---|---|
| Total thickness/μm | 319 | 190 | 220 |
| Number of tests | 5 | 5 | 5 |
| Extrusion | 300-bright spot | 300-black spot | 360-black spot |
| resistance: | 300-bright spot | 280-bright spot | 280-bright spot |
| Minimum pressure | 300-bright spot | 320-black spot | 360-black spot |

TABLE 2-continued

| Results of Back Extrusion Test | | | |
|---|---|---|---|
| Scheme | Comparative Example | Example 1 | Example 2 |
| at bright/black spot appeared/N | 340-bright spot<br>340-bright spot | 300-black spot<br>320-black spot | 320-bright spot<br>340-black spot |

In the back drop test, the sample panel is illuminated first, and a steel ball with diameter of φ14 mm, weight 11.2 g and ball head of which is stainless steel is controlled to fall on the back of the sample panel. The steel ball is dropped down at 20 points (the ball is dropped at 20 points on the back of the sample panel). An initial height for dropping is 35 mm, and each increase is 5 mm until a bright/black spot appears on appearance. Table 3 as follows is obtained.

TABLE 3

| Results of Back Drop Test | | | |
|---|---|---|---|
| Scheme | Comparative Example | Example 1 | Example 2 |
| Total thickness/μm | 319 | 190 | 220 |
| Number of tests | 3 | 3 | 3 |
| Back drop performance: Minimum height at bright/black spot appeared/mm | 40-bright spot<br>40-bright spot<br>40-bright spot | 50-bright spot<br>55-bright spot<br>60-bright spot | 70-bright spot<br>60-bright spot<br>60-bright spot |

As can be seen from Table 1, Table 2 and Table 3, the composite functional layer 20 provided in Examples 1 and 2 of the present application is superior to the back plate 2 and the heat dissipation composite material 3 in the comparative example in the mark test. In the back extrusion test, the results can be kept even better than the back plate 2 and the heat dissipation composite material 3 in the comparative example. In the back drop test, the results are also superior to the back plate 2 and the heat dissipation composite material 3 in the comparative example. That is, the support performance and the buffer performance of the composite functional layer 20 provided in the embodiments of the present application are significantly superior to the back plate 2 and the heat dissipation composite material 3 in the comparative example, and the thickness of the composite functional layer 20 is much less than the sum of the thickness of the back plate 2 and the heat dissipation composite material 3 in the comparative example. That is, the composite functional layer 20 provided in the embodiments of the present application has better performance on support and buffer, and less thickness, to replace the back plate 2 and the heat dissipation composite material 3 in the related art, to reduce the number of film layers in the display module, and to reduce the distance between the binding portion 12 and the display portion 11. As such, the bending radius of the bending portion 13 is reduced, thereby reducing the bezel width of the display module.

Further, the thickness of the third adhesive layer 25 is greater than or equal to the difference between the thickness of the first sub-portion 221 and the thickness of the second sub-portion 222. That is, the distance from the side surface of the binding portion 12 away from the display portion 11 to the display portion 11 is greater than or equal to the distance from the side surface of the first sub-portion 221 away from the display portion 11 to the display portion 11. The flexible circuit board 42 is prevented from being lifted to cause an uneven surface by the first sub-portion 221 during attaching the binding portion 12 to the second sub-portion 222, thereby reducing the occurrence of wire breakage on the flexible circuit board 42.

In the direction along the second sub-portion 222 toward the first sub-portion 221, the distance from the binding portion 12 to the first sub-portion 221 is greater than or equal to 0, and less than or equal to 300 μm. That is, the boundary of the binding portion 12 is not beyond the boundary of the second sub-portion 222 and the first sub-portion 221, to avoid the occurrence that the binding portion 12 and the third adhesive layer 25 are poorly adhered at the boundary of the second sub-portion 222 and the first sub-portion 221.

In an embodiment, the third adhesive layer 25, the second sub-portion 222, the second adhesive layer 24, the buffer sublayer 21, and the first adhesive layer 23 are flush at ends close to the bending portion 13.

Referring to FIG. 2, FIG. 3, FIG. 4, FIG. 5, and FIG. 6, during assembling the composite functional layer 20 and the display panel 10 according to the embodiments of the present application, the buffer sublayer 21 is first provided with adhesive tapes on both sides, i.e., the buffer sublayer 21 is provided with a first adhesive layer 23 and a second adhesive layer 24 on a side respectively.

Then, the buffer sublayer 21 is attached to the display panel 10 at a position corresponding to the display portion 11 by the first adhesive layer 23. The support sublayer 22 is attached to the side of the buffer sublayer 21 away from the display portion 11 by the second adhesive layer 24, and the third adhesive layer 25 is provided on the side of the binding portion 12 close to the buffer sublayer 21.

Next, the bending portion 13 is bent toward the side of the display portion 11 close to the support sublayer 22 so that the binding portion 12 is attached to the side of the second sub-portion 222 away from the display portion 11 by the third adhesive layer 25.

It should be noted that the driving chip 41 and the flexible circuit board 42 (not shown) may be pre-bonded on the side of the binding portion 12 away from the third adhesive layer 25.

In the embodiments of the present application, the buffer sublayer 21 is made of a polyurethane rubber material containing silicon, and the support sublayer 22 is made of a material having a relatively large elastic modulus, such as stainless steel, carbon fiber, or aluminum alloy, so that the buffer sublayer 21 has a better buffer performance, a better antistatic performance, and a better heat dissipation performance. and the support sublayer 22 has a better support performance. Meanwhile, the buffer sublayer 21 and the support sublayer 22 in the embodiment of the present application can be thinned so that the distance between the binding portion 12 and the display portion 11 in the thickness direction of the composite functional layer 20 is reduced to 260 μm or less, which is much less than 490 μm-950 μm in the related art. As such, the distance between the binding portion 12 and the display portion 11 is effectively reduced, so that the bending radius of the bending portion 13 is reduced. Thus, the bezel width on the side of the display module corresponding to the bending portion 13 can be reduced, to provide narrow bezel for the display module.

Figure 7:
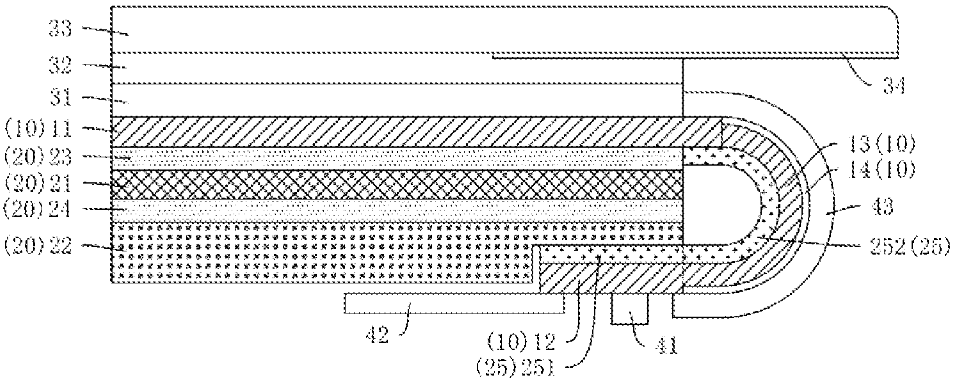
FIG. 7 is another schematic structural diagram of a display module according to an embodiment of the present application.

Referring to FIG. 7, in another embodiment of the present application, which differs in that the third adhesive layer 25 is provided not only between the binding portion 12 and the support sublayer 22, but also on a side of the bending portion 13 close to the composite functional layer 20.

The third adhesive layer 25 includes a first adhesive 251 disposed between the binding portion 12 and the support sublayer 22, and a second adhesive 252 disposed on the side of the bending portion 13 close to the composite functional layer 20, and the first adhesive 251 is connected to the second adhesive 252. Further, at least the elastic modulus of the second colloid 252 is less than the elastic modulus of the first adhesive layer 23, and less than the elastic modulus of the second adhesive layer 24. Since the second adhesive 252 needs to be bent along with the bending portion 13, the embodiments of the present application can improve the bending performance of the second adhesive 252 by reducing the elastic modulus of the second adhesive 252. In addition, the elastic modulus of both the first adhesive 251 and the second adhesive 252 may be less than the elastic modulus of the first adhesive layer 23, and less than the elastic modulus of the second adhesive layer 24.

It should be noted that, in the embodiments of the present application, the thickness of the third adhesive layer 25 can be reduced to further improve the bending performance of the second adhesive body 252. It is necessary to satisfy that the distance from the side surface of the binding portion 12 away from the display portion 11 to the display portion 11 is greater than the distance from the side surface of the first sub-portion 221 away from the display portion 11 to the display portion 11.

In this embodiment of the present application, the buffer sublayer 21 is made of a polyurethane rubber material containing silicon, and the support sublayer 22 is made of a material having a relatively large elastic modulus, such as stainless steel, carbon fiber, or aluminum alloy, so that the buffer sublayer 21 has a better buffer performance, a better antistatic performance, and a better heat dissipation performance. and the support sublayer 22 has a better support performance. Meanwhile, the buffer sublayer 21 and the support sublayer 22 in the embodiment of the present application can be thinned so that the distance between the binding portion 12 and the display portion 11 in the thickness direction of the composite functional layer 20 is reduced to 260 μm or less, which is much less than 490 μm-950 μm in the related art. As such, the distance between the binding portion 12 and the display portion 11 is effectively reduced, so that the bending radius of the bending portion 13 is reduced. Thus, the bezel width on the side of the display module corresponding to the bending portion 13 can be reduced, to provide narrow bezel for the display module. Moreover, in the present embodiment, the third adhesive layer 25 can be extended to the side of the bending portion 13 close to the composite functional layer 20, so that the third adhesive layer 25 does not need to be cut with high precision compared with the previous embodiment, thereby simplifying the process.

In addition, the embodiments of the present application further provide a display device including a device body and the display module described in the above embodiments, wherein the device body and the display module are integrated together.

The device body may include a bezel body, a power source, and the like. The display device may be a display device such as a television, a mobile phone, a tablet, or a computer.

In the above-mentioned embodiments, the description of each embodiment has its own emphasis, and the parts not described in detail in a certain embodiment may be referred to the related description of other embodiments.

The present application is described in detail with reference to a display module and a display device according to the embodiments of the present application. Specific examples are used to illustrate the principles and application of the present application. The description of the above embodiments is merely provided to help understand the technical solution and the core idea of the present application. It should be understood by those of ordinary skill in the art that modifications may still be made to the technical solutions described in the embodiments, or equivalents may be made to some of the technical features therein. These modifications or substitutions do not depart the essence of the technical solutions from the scope of the technical solutions of the embodiments of the present application.

The invention claimed is:

1. A display module, wherein the display module comprises a display panel and a composite functional layer, and the display panel comprises:

a display portion;

a binding portion provided on a side of the display portion; and a bending portion, wherein an end of the bending portion is connected to the display portion, and another end of the bending portion is bent toward a side of the display portion close to the binding portion and is connected to the binding portion;

wherein the composite functional layer comprises a buffer sublayer attached to the side of the display portion close to the binding portion, and a support sublayer attached to a side of the buffer sublayer away from the display portion; the binding portion is attached to a side of the support sublayer away from the buffer sublayer; and the buffer sublayer comprises a polyurethane rubber material containing silicon;

wherein the support sublayer comprises a first sub-portion, and a second sub-portion disposed on a side of the first sub-portion close to the bending portion; the second sub-portion has a thickness less than the first sub-portion; a distance from a side surface of the second sub-portion away from the display portion to the display portion is less than a distance from a side surface of the first sub-portion away from the display portion to the display portion; and wherein the binding portion is attached to a side of the second sub-portion away from the display portion.

2. The display module of claim 1, wherein a distance between the binding portion and the display portion in a thickness direction of the composite functional layer is less than 260 μm.

3. The display module of claim 1, wherein a distance between the binding portion and the display portion in a thickness direction of the composite functional layer is greater than or equal to 128 μm, and less than or equal to 248 μm.

4. The display module of claim 1, wherein a thickness of the buffer sublayer is greater than or equal to 40 μm, and less than or equal to 150 μm; and elastic modulus of the buffer sublayer is greater than or equal to 50 kPa, and less than or equal to 500 kPa.

5. The display module of claim 1, wherein elastic modulus of the support sublayer is greater than or equal to 50 GPa, and less than or equal to 250 GPa.

6. The display module of claim 1, wherein the support sublayer has a thickness greater than or equal to 30 μm, and less than or equal to 150 μm.

7. The display module of claim 1, wherein the composite functional layer further comprises a first adhesive layer disposed between the buffer sublayer and the display portion, and a second adhesive layer disposed between the buffer sublayer and the support sublayer;

wherein a thickness of the first adhesive layer is greater than or equal to 13 μm, and less than or equal to 50 μm; and a thickness of the second adhesive layer is greater than or equal to 35 μm, and less than or equal to 50 μm.

8. The display module of claim 7, wherein at least one of the first adhesive layer and the second adhesive layer comprises a black adhesive material, and at least one of the first adhesive layer and the second adhesive layer is doped with carbon powder particles.

9. The display module of claim 1, wherein the composite functional layer at least comprises a third adhesive layer disposed between the binding portion and the support sublayer, the binding portion is attached to the side of the second sub-portion away from the display portion by the third adhesive layer;

wherein a thickness of the third adhesive layer is greater than or equal to a difference between a thickness of the first sub-portion and a thickness of the second sub-portion.

10. The display module of claim 9, wherein the thickness of the third adhesive layer is greater than or equal to 50 μm, and less than or equal to 100 μm.

11. The display module of claim 9, wherein the third adhesive layer comprises a first adhesive disposed between the binding portion and the support sublayer, and a second adhesive attached to a side of the bending portion close to the composite functional layer; and the second adhesive is connected to the first adhesive.

12. The display module of claim 9, wherein at least one of the buffer sublayer and the third adhesive layer is doped with carbon powder particles.

13. The display module of claim 1, wherein a distance from the binding portion to the first sub-portion is greater than or equal to 0, and less than or equal to 300 μm in a direction along the second sub-portion toward the first sub-portion.

14. A display device, wherein the display device comprises a display module with a display panel and a composite functional layer, and the display panel comprises:

a display portion;

a binding portion provided on a side of the display portion; and a bending portion, wherein an end of the bending portion is connected to the display portion, and another end of the bending portion is bent toward a side of the display portion close to the binding portion and is connected to the binding portion;

wherein the composite functional layer comprises a buffer sublayer attached to the side of the display portion close to the binding portion, and a support sublayer attached to a side of the buffer sublayer away from the display portion; the binding portion is attached to a side of the support sublayer away from the buffer sublayer; and the buffer sublayer comprises a polyurethane rubber material containing silicon;

wherein the support sublayer comprises a first sub-portion, and a second sub-portion disposed on a side of the first sub-portion close to the bending portion; the second sub-portion has a thickness less than the first sub-portion; a distance from a side surface of the second sub-portion away from the display portion to the display portion is less than a distance from a side surface of the first sub-portion away from the display portion to the display portion; and wherein the binding portion is attached to a side of the second sub-portion away from the display portion.

15. The display device of claim 14, wherein a distance between the binding portion and the display portion in a thickness direction of the composite functional layer is less than 260 μm.

16. The display device of claim 14, wherein the composite functional layer further comprises a first adhesive layer disposed between the buffer sublayer and the display portion, and a second adhesive layer disposed between the buffer sublayer and the support sublayer;

wherein a thickness of the first adhesive layer is greater than or equal to 13 μm, and less than or equal to 50 μm; and a thickness of the second adhesive layer is greater than or equal to 35 μm, and less than or equal to 50 μm.

17. The display device of claim 16, wherein at least one of the first adhesive layer and the second adhesive layer comprises a black adhesive material, and at least one of the first adhesive layer and the second adhesive layer is doped with carbon powder particles.

18. The display device of claim 15, wherein the composite functional layer at least comprises a third adhesive layer disposed between the binding portion and the support sublayer, the binding portion is attached to the side of the second sub-portion away from the display portion by the third adhesive layer;

wherein a thickness of the third adhesive layer is greater than or equal to a difference between a thickness of the first sub-portion and a thickness of the second sub-portion.

19. The display device of claim 18, wherein the thickness of the third adhesive layer is greater than or equal to 50 μm, and less than or equal to 100 μm.

20. The display device of claim 18, wherein the third adhesive layer comprises a first adhesive disposed between the binding portion and the support sublayer, and a second adhesive attached to a side of the bending portion close to the composite functional layer; and the second adhesive is connected to the first adhesive.

* * * * *